United States Patent
Marx et al.

(10) Patent No.: US 6,433,535 B1
(45) Date of Patent: Aug. 13, 2002

(54) ARRANGEMENT FOR AND METHOD OF DETECTING THE ANGLE OF ROTATION OF A ROTATABLE ELEMENT

(75) Inventors: Klaus Marx, Stuttgart; Hartmut Kittel, Weissach-Flacht; Franz Jost, Stuttgart, all of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/530,077
(22) PCT Filed: Jun. 2, 1999
(86) PCT No.: PCT/DE99/01632
§ 371 (c)(1), (2), (4) Date: Apr. 20, 2000
(87) PCT Pub. No.: WO00/12957
PCT Pub. Date: Mar. 9, 2000

(30) Foreign Application Priority Data

Aug. 29, 1998 (DE) .......................... 198 39 446

(51) Int. Cl.$^7$ .............................. G01B 7/14; G01B 7/30
(52) U.S. Cl. .............................. 324/207.21; 324/207.25
(58) Field of Search .................... 324/207.2, 207.21, 324/207.25, 251, 225, 207.12, 207.19

(56) References Cited

U.S. PATENT DOCUMENTS

| | | | |
|---|---|---|---|
| 5,435,070 A | | 7/1995 | Kilian |
| 5,796,249 A | | 8/1998 | Andra |
| 5,880,586 A | * | 3/1999 | Dukart et al. ............ 324/207.2 |
| 6,104,187 A | * | 8/2000 | Marx et al. ............ 324/207.21 |

FOREIGN PATENT DOCUMENTS

| | | |
|---|---|---|
| DE | 197 22 016 | 4/1997 |
| DE | 196 42 752 A1 | 12/1997 |
| EP | 0 685 707 A1 | 12/1995 |

* cited by examiner

Primary Examiner—Edward Lefkowitz
Assistant Examiner—Subhash Zaveri
(74) Attorney, Agent, or Firm—Michael J. Striker

(57) ABSTRACT

An arrangement for detecting the angle of rotation of a rotatable element, in which, with evaluation of magnetically variable properties of a sensor arrangement, a first magnetic field, generated or varied by a rotatable element, is detectable in an evaluation circuit and usable for ascertaining the angle of rotation, wherein the sensor arrangement, utilizing the magnetoresistive effect, furnishes signals that can be associated unambiguously with one direction of the magnetic field $B_{ext}$ over a first angular range, in particular an angular range of 360°, having means to for is selective application of a magnetic auxiliary field $B_H$ the sensor arrangement, by means of which signals a modification of the signals that can be associated with the direction of the first magnetic field $B_{ext}$, attainable for the sake of unambiguous association of an angle over a second angular range, in particular 360°.

13 Claims, 2 Drawing Sheets

Figure 1:
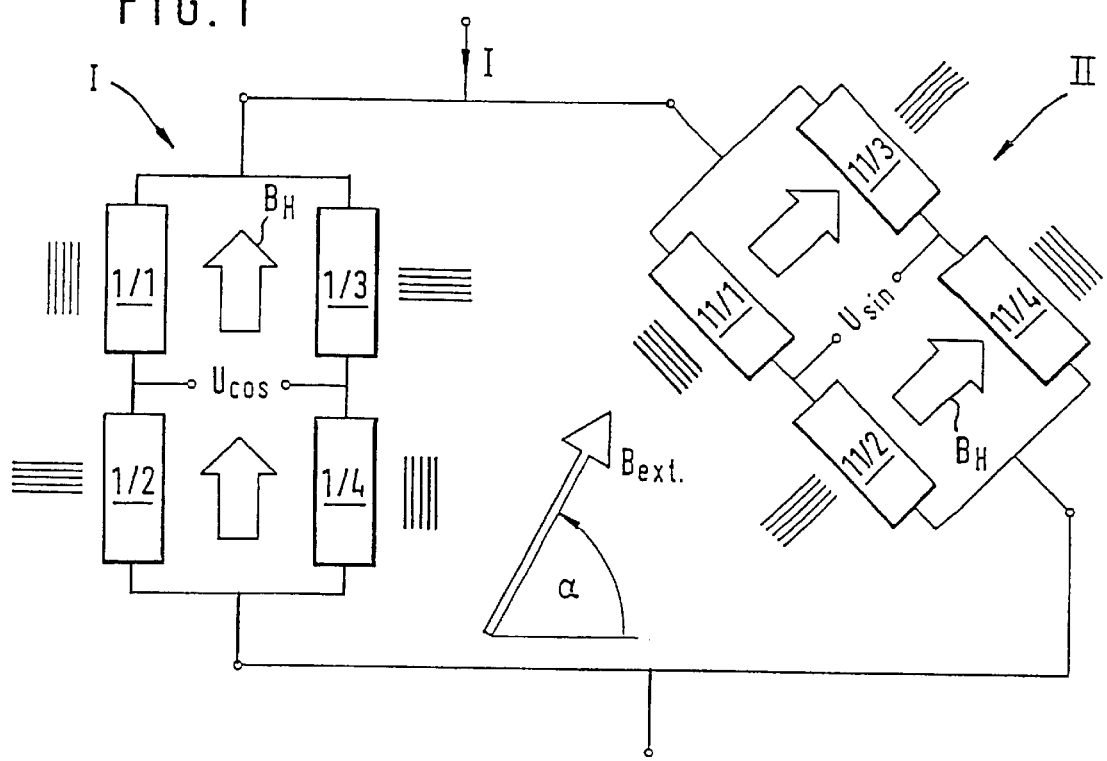

ARRANGEMENT FOR AND METHOD OF DETECTING THE ANGLE OF ROTATION OF A ROTATABLE ELEMENT

The present invention relates to an arrangement for detecting the angle of rotation of a rotatable element as generically defined by the preamble to claim 1 and to a corresponding method as generically defined by the preamble to claim 9.

Arrangements of this kind, with which a contactless detection of the angle of rotation can be performed, are known for instance from Published, Nonexamined German Patent Application DE-OS 195 43 562. In these arrangements, a magnet is connected to the rotatable shaft whose angular position is to be ascertained. The magnetic field, which varies with the angle of rotation of the shaft, is measured with the aid of two sensor elements, These sensor elements are either two Hall sensor elements, which are rotated by an angle of 90° relative to one another, or two magnetoresistive sensor elements, which are rotated by 45° relative to one another. These sensor elements are supplied with alternating voltage signals that are phase-shifted relative to one another in a suitable way. The superposition of the output signals of the sensor elements produces a signal course which is representative for the angular position. The arrangements for contactless detection of the sensor element that are described in this reference each have two identical sensor elements. This can have disadvantages, since Hall sensors for instance have a high temperature dependency and a high stress dependency. Magnetoresistive sensor elements, conversely, have more favorable properties with regard to the temperature and stress dependency, and are less temperature- and stress-dependent than Hall sensors, but they do have the disadvantage that because of the physical effect, an angular range of only 180° can be detected unambiguously, Such an angular range is too small for detecting the position of the camshaft of an internal combustion engine, for instance, or in steering wheel angle measuring methods.

From German Patent Disclosure DE-P 197 22 016, an arrangement for contactless detection of the angle of rotation of a rotatable element is known, in which, utilizing magnetically variable properties of a sensor arrangement with at least two sensor elements, a magnetic field intensity generated or varied by the rotatable element is detected in an evaluation circuit and used to ascertain the rotary position; one sensor element functions utilizing the magnetoresistive effect, and the other sensor element functions using the Hall effect, and the signals output by the two sensor elements are combined with one another. Combining magnetoresistive sensors and sensor elements proves in practice to be very complicated and expensive.

The object of the present invention is to create an arrangement and a method for detecting the angle of rotation with which the largest possible angular range, and in particular 0°–360°, can be detected unambiguously at low effort and expense.

This object is attained by an arrangement having the characteristics of claim 1 and by a method having the characteristics of claim 9.

According to the invention, it is now possible for the first time to use a magnetoresistive sensor arrangement for unambiguous determination of an angle between 0° and 360°. In contrast to sensor arrangements of the prior art, no additional Hall sensors are needed here. As a result, the expense for furnishing an arrangement for detecting an angle of rotation are reduced. Advantageous applications arise for instance in detecting the position of a camshaft of an internal combustion engine. The present invention can also be advantageously employed in steering wheel angle measuring methods, since the increase in the nonambiguity range to 360° that is achieved over conventional methods leads to an increase in the tolerance limits of the entire system.

Advantageous features of the invention are the subject of the dependent claims.

In one preferred feature, the sensor arrangement has a number of magnetoresistive elements, which are At interconnected to form at least two bridge circuits, in particular Wheatstone bridges, of which one bridge furnishes a signal associated with the cosine of the angle of the first magnetic field $B_{ext}$ to be detected with respect to a reference direction, and a further bridge furnishes a signal associated with the sine of this angle. On the basis of these linearly independent signals, signal evaluation is simple to perform.

Expediently, the magnetoresistive elements are embodied as AMR gauge strips. Such gauge strips can be applied to a substrate in a suitable orientation in a relatively simple and inexpensive way.

It is preferred that the current flow directions in each of two magnetoresistive elements associated with one bridge branch of the bridge circuits extend perpendicular to one another.

Expediently, the bridge circuits are rotated, in particular by an angle of 45°, relative to one another. With this arrangement, sine and cosine can be extracted in a simple way.

It is preferred that the magnetic auxiliary field $B_H$ has different directions in the bridge circuits, and these directions in particular form an angle of 45°.

Expediently, the magnetoresistive elements are embodied in meander form. As a result of this provision, higher sensor signals that are simpler to evaluate can be attained.

It is preferred that the magnetic auxiliary field $B_H$ be generated by means of a planar coil, which by means of a nonconductive intermediate layer is disposed in electrically insulated fashion with respect to the magnetoresistive elements. With such a coil, the expense for wiring is relatively low; moreover, both the amount and direction of the auxiliary field $B_H$ are adjustable in a desired way.

According to a preferred embodiment of the method of the invention, the correlation is performed by means of a range function F taking the form $$F=((0° \leq \alpha_{AMR180} \leq f(\alpha_1,\alpha_2)) \text{ AND } ((\delta U_{cos}>S) \text{ OR } ((\delta U_{sin}<-S) \\ \text{AND } (|\delta U_{cos}|<S)))) \text{ OR } ((f(\alpha_1,\alpha_2)<\alpha_{AMR180} \leq 180°) \text{ AND } \\ ((\delta U_{cos}>S) \text{ OR } ((\delta U_{sin}>S) \text{ AND } (|\delta U_{cos}|<S)))),$$

in which $\alpha_{AMR180}$ represents an angle of rotation detected with a 180° nonambiguity range, without the application of the auxiliary field $B_H$; S represents an adjustable significance threshold; $\delta U_{cos}$ and $\delta U_{sin}$, represent the angle-dependent variation signals of the sensor arrangement; and $f(\alpha_1,\alpha_2)$ represents an addition or subtraction function of the angular orientations of the bridge circuits or of the auxiliary field at the site of the applicable bridge circuits with respect to a reference direction. In this way, a method that can be performed inexpensively in terms of computation is made available for unambiguous determination of an angle of rotation over an angular range of 360°. The form of the range function depends on the direction of the magnetic auxiliary field $B_H$ in the respective bridge circuits. A distinction can be made between the angular ranges of $0 \leq \alpha \leq 180°$ and $180° \leq \alpha \leq 360°$ by using a magnetic auxiliary field $B_H$ for arbitrary directions of the auxiliary field $B_H$; care must be taken to assure that the direction of $B_H$ at the site of the bridge circuit 1 differs from that at the site of the bridge circuit 11. It is advantageous in particular if the $B_H$ directions differ by 45°.

In an especially preferred embodiment of the method of the invention, $f(\alpha_1,\alpha_2)$ is a function taking the form $\alpha_1+\alpha_2$. For the case where the auxiliary field $B_H$ is applied in the direction $\alpha=90°$ at the site of the bridge circuit 1 and in the direction $\alpha=45°$ at the site of the bridge circuit 11, the resultant range function is for instance $$F=((0°\leq\alpha_{AMR180}\leq f(\alpha_1,\alpha_2))\text{ AND }((\delta U_{cos}>S)\text{ OR }((\delta U_{sin}<-S)\\ \text{ AND }(|\delta U_{cos}|<S))))\text{ OR }((135°<\alpha_{AMR180}\leq 180°)\text{ AND }\\ ((\delta U_{cos}>S)\text{ OR }((\delta U_{sin}>S)\text{ AND }(|\delta U_{cos}|<S)))).$$

In a further especially preferred embodiment of the method of the invention, $f(\alpha_1,\alpha_2)$ is a function taking the form $|a_1-a_2|$. For the case where the magnetic auxiliary field $B_H$ has a direction of $\alpha=90°$ at the site of the bridge circuit 1 and a direction of $\alpha=135°$ at the site of the bridge circuit 1, the resultant range function is for instance $$F=((0°\leq\alpha_{AMR180}\leq f(\alpha_1,\alpha_2))\text{ AND }((\delta U_{cos}>S)\text{ OR }((\delta U_{sin}<-S)\\ \text{ AND }(|\delta U_{cos}|<S))))\text{ OR }((45°<\alpha_{AMR180}\leq 180°)\text{ AND }\\ ((\delta U_{cos}>S)\text{ OR }((\delta U_{sin}>S)\text{ AND }(|\delta U_{cos}|<S)))).$$

Figure 2:
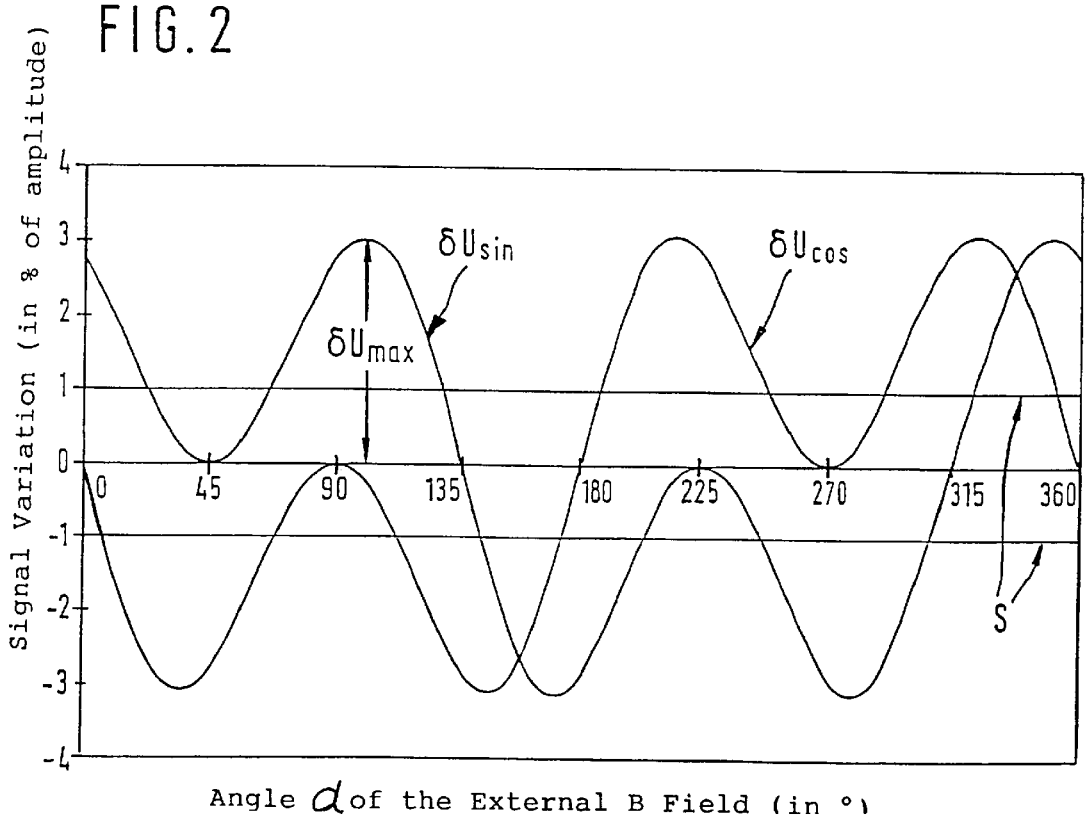
Figure 3:
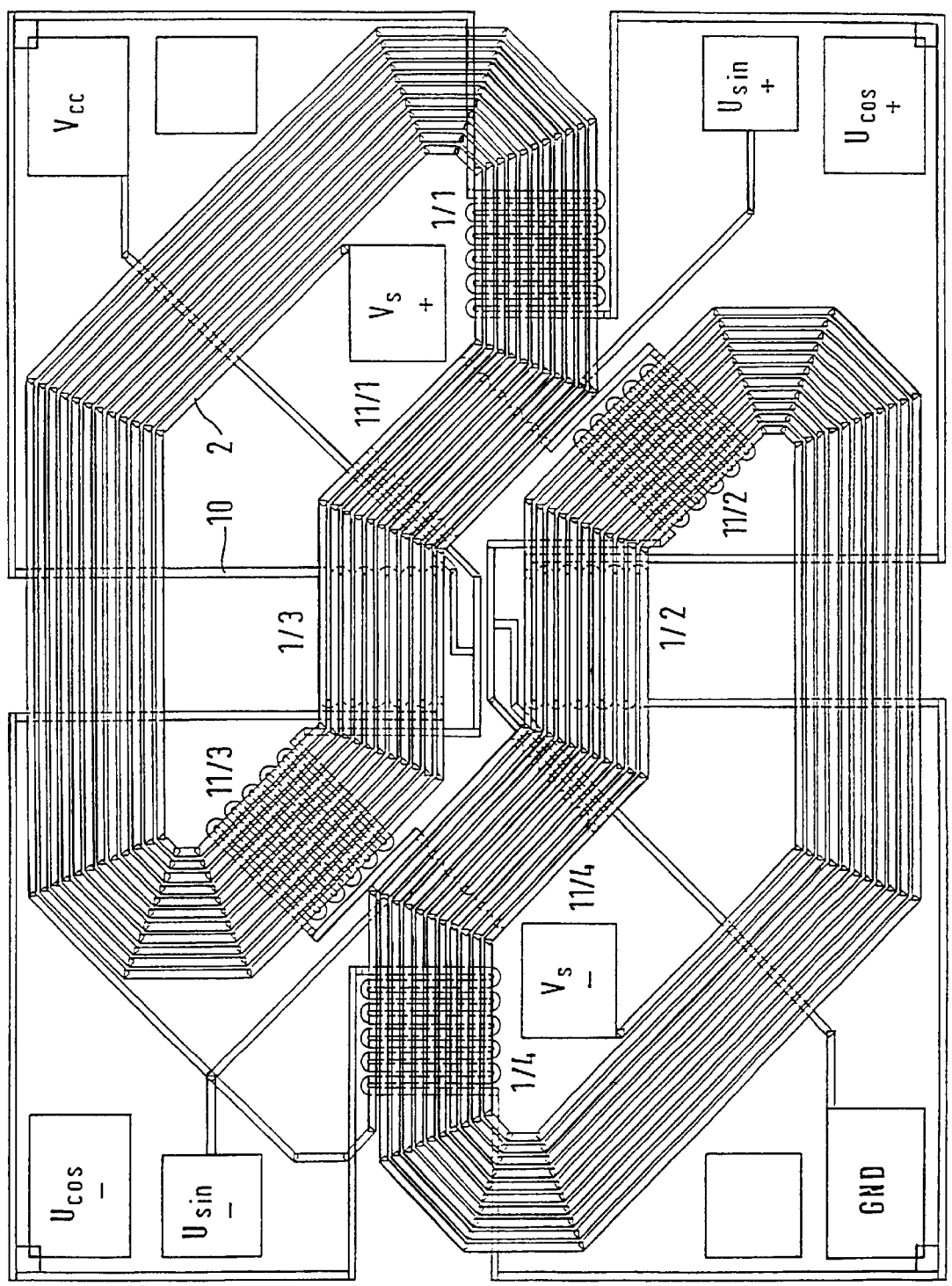

The invention will now be described in detail in terms of a preferred embodiment in conjunction with the accompanying drawing. In the drawing, FIG. 1 schematically shows a preferred embodiment of an arrangement for detecting the angle of rotation of a rotatable element;

FIG. 2 shows variations in cosine and sine bridge signal voltages that occur in the arrangement according to the invention for detecting an angle of rotation upon the application of a magnetic auxiliary field, as a function of the direction of the external magnetic field to be detected; and FIG. 3 is a plan view on one possible layout of a preferred embodiment of an arrangement according to the invention for detecting an angle of rotation.

The sensor arrangement shown in FIG. 1 of an arrangement of the invention for detecting an angle of rotation has two Wheatstone bridges 1, 11. As magnetoresistive elements, the respective Wheatstone bridges 1, 11 have anisotropic magnetoresistance thin-film sensors or AMR gauge strips 1/1–1/4 and 11/1–11/4, respectively.

The electrical resistance of AMR materials, such as Permalloy, depends on the angle between the direction of magnetization, or the direction of an applied magnetic field $B_{ext}$, and the direction of an electric current I flowing through the AMR materials. The current direction within the AMR gauge strip is represented schematically in FIG. 1 by the line systems associated with the respective AMR gauge strips (it can be seen that the respective bridge branches of the Wheatstone bridges each have two AMR gauge strips with current directions extending perpendicular to one another). While the current direction is dictated by the geometry of the AMR gauge strips, the direction of magnetization follows the direction of the external magnetic field to be detected. In terms of what is shown in FIG. 1, the direction corresponding to an angle of rotation $\alpha$ of the external magnetic field $B_{ext}$ is represented by an elongated arrow. The angular dependency of the electrical resistance of the AMR gauge strips has a 180° periodicity; the resistance is maximal when the direction of magnetization is parallel or antiparallel to the current direction, and it is minimal when the direction of magnetization is perpendicular to the current direction. The AMR gauge strips 1/1–1/4 and 11/1–11/4 each interconnected to form one Wheatstone bridge 1, 11, respectively, serve to extract the angle-dependent useful signal. The signal $U_{cos}$ obtained from the Wheatstone bridge 1 has a 180° periodicity and a cosine-type course $U_{cos} \sim \cos(2\alpha)$. The angle $\alpha$, as noted, indicates the direction of the external magnetic field to be detected. The second Wheatstone bridge 11 is rotated by 45° relative to the first Wheatstone bridge 1. The AMR gauge strips are disposed accordingly, so that the Wheatstone bridge 11 furnishes a sinusoidal output signal $U_{sin} \sim \sin(2\alpha)$. By arc tangent formation in an electronic evaluation circuit (not shown), the angle $\alpha$ to be measured is obtained.

Because of the 2α-dependency of the bridge voltages, a 180° periodicity exists, and thus an absolute angle indication can be made only for the range of $0°\leq\alpha\leq 180°$.

To distinguish between the two angular ranges $0°\leq\alpha\leq 180°$ and $180°\leq\alpha\leq 360°$, an auxiliary magnetic field $B_H$ is briefly applied, as represented in FIG. 1 by the broader arrows. As a result of this magnetic field $B_H$, the direction of magnetization in the AMR gauge strip 1/11/4 and 11/1–11/4 varies slightly, so that the signals $U_{cos}$ and $U_{sin}$ derived from the respective Wheatstone bridges 1, 11 undergo a corresponding variation as well. These signal or voltage variations $\delta U_{cos}$ and $\Delta U_{sin}$ relative to the measurement without an applied auxiliary field $B_H$ are evaluated in a logical linkage, known as the range function. The range function, which will be explained in detail hereinafter, can assume the logical values of "0" or "1", thus making it possible to decide whether the measured angle $\alpha$ is located in the range from 0°–180° or in the range from 180°–360°. Thus by means of an AMR angle sensor arrangement, an absolute angle measurement is attainable over the entire range from 0°–360°.

The direction of the magnetic auxiliary field (angle $\alpha_2$) applied to the Wheatstone bridge 11 has a direction that differs by 45° from the auxiliary field $B_H$ (angle $\alpha_1$) applied to the Wheatstone bridge 1. This is shown as an example in FIG. 1, in which the auxiliary field $B_H$ at the Wheatstone bridge 11 is oriented in the direction $\alpha_2=45°$ and in the Wheatstone bridge 1 in the direction $\alpha_1=90°$. The associated signal variations $\delta U_{cos}$ and $\delta U_{sin}$ for this orientation of the auxiliary field $B_H$ are shown in FIG. 2. For reliable evaluation of the voltage variations, a significance threshold S is defined. The significance threshold S can be selected within a wide bandwidth, for instance of $0.05\cdot\delta U_{max}\leq S\leq 0.35\cdot\delta U_{max}$. In FIG. 2, a significance threshold $S=0.33\cdot\delta U_{max}$ is selected. If $\alpha_{AMR180}$ now designates the angle that is measured with an auxiliary field, and if because of the 180° periodicity it is restricted to the nonambiguity range 0°–180°, then the logical range function F is as follows:

$$F=((0°\leq\alpha_{AMR180}\leq f(\alpha_1,\alpha_2))\text{ AND }((\delta U_{cos}>S)\text{ OR }((\delta U_{sin}<-S)\\ \text{ AND }(|\delta U_{cos}|<S))))\text{ OR }((135°<\alpha_{AMR180}\leq 180°)\text{ AND }\\ ((\delta U_{cos}>S)\text{ OR }((\delta U_{sin}>S)\text{ AND }(|\delta U_{cos}|<S)))).$$

in which

F=FALSE or "0" means that the angle $\alpha$ of the field direction to be detected of the external magnetic field $B_{ext}$ is located in the range from 0°–180°; that is, $\alpha=\alpha_{AMR180}$; and F=TRUE or "1" means that the $\alpha$ of the field direction to be detected of the magnetic field $B_{ext}$ is in the range from 180°–360°, or in other words $\alpha=\alpha_{AMR180}+180°$.

In Table 1 below, the logical linkage of the range function is shown in detail. It can be seen that the signal variation $\delta U_{sin}$ is used for the range decision only whenever the amount of the signal variation $\delta U_{cos}$ is below the significance threshold S. This case occurs, in terms of FIG. 2, in particular for angular ranges around $\alpha=0°$, $90°$, $180°$, $270°$, and $360°$, or where $\alpha_{AMR180}=0°$, $90°$ and $180°$.

| $\delta U_{cos}$ | $\delta U_{sin}$ | $\alpha_{AMR180}$ | F |
|---|---|---|---|
| − | +;?;− | u;o | 0 |
| + | +;?;− | u;o | 1 |
| ? | + | u | 0 |
| ? | − | u | 1 |
| ? | − | o | 0 |
| ? | + | o | 1 |

The logical range function F here assumes the following values: 0, if $0° \leq \alpha \leq 180°$, and
1, if $180° \leq \alpha \leq 360°$.
For $\alpha_{AMR180}$, the logical states:
u, if $0° \leq \alpha_{AMR180} \leq 135°$, and
o, if $135° \leq \alpha_{AMR180} \leq 180°$,
are definitive.

The logical states of the functions $\delta U_{cos}$ and $\delta U_{sin}$ are defined as follows:
+, if $\delta U > +S$,
?, if $|\delta U| < +S$, and
−, if $\delta U < -S$.

In FIG. 3, a preferred layout of a 360° AMR angle sensor of the invention, which can be produced by thin-film technology, is shown. The individual AMR gauge strips or resistors are again designated here by reference numerals 1/1–1/4 (COS bridge) and 11/1–11/4 (SIN bridge). The thickness of these resistors is typically in the range from 20 nm to 50 nm. The strip width is 10 μm, for instance. The interconnection or metallizing of the AMR resistors 1/1–1/4 and 11/1–11/4 to form two Wheatstone bridges is realized for instance by means of aluminum or copper strips 10 using thin-film technology.

The auxiliary field $B_H$ is generated by a thin-film planar coil 2, which is electrically insulated by a nonconductive intermediate layer, typically 200 nm to 500 nm thick, and is located above the AMR resistors 1/1–1/4 and 11/1–11/4 or their metallizing. The form of the planar coil 2 is selected such that the auxiliary field $B_H$, as shown in FIG. 1, is oriented in the direction $\alpha=90°$ in the region of the Wheatstone bridge 1 (COS bridge) and in the direction $\alpha=45°$ in the region of the Wheatstone bridge 11 (SIN bridge) and extends parallel to the film plane in the region of the AMR gauge strips. In particular, the coil windings of the planar coil 2 extend parallel and perpendicular to the direction of the strip or meander of the AMR resistors. The width of the coil windings of the planar coil 2 typically depends on the width of the AMR resistors. In the example shown, it is 12 μm. The film thickness of the coil windings of the planar coil 2 is typically in the range from 500 nm to 1000 nm. In the example. shown, the Wheatstone bridges 1, 11 are connected parallel. The entire sensor element, including the two coil terminals, has eight terminal pads, namely $U_{cos-}$, $U_{cos+}$, $U_{sin-}$, $U_{sin+}$, $V_{cc}$, $V_{s-}$, $V_{s+}$, and GND. They can easily be housed in a suitable package, in particular an SOIC8 package.

The generation of the magnetic auxiliary field $B_H$ by a planar coil 2 is not limited to the disposition and meandering form of the AMR resistors in FIG. 3. The embodiment and disposition of the AMR resistors need merely assure that the current direction in the resistors of the Wheatstone bridges 1, 11 extend in the directions indicated in FIG. 1. Thus it is also possible to generate auxiliary field by means of a planar coil 2 in alternative arrangements of the AMR resistors, for instance in the star-shaped internested form described in European Patent Disclosure EP 0 671 605 A2. It is also possible, instead of the meandering AMR resistors or resistor strips, to provide a series circuit of arbitrary rectangular, square, circular or elliptical AMR thin-film structures, of the kind described for instance in International Patent Disclosure WO 97/00426 A1 and German Patent DE 43 27 458 C2.

The evaluation circuit (not shown in detail) is supplied with the variables required for achieving the range function. Ascertaining the angle $\alpha_{AMR180}$ without an applied auxiliary field $B_H$, or in other words when the planar coil 2 is currentless, is done for instance via a microprocessor circuit by a known method, by calculating the arc tangent using the formula $\alpha=0.5 \cdot \arctan(U_{sin}/U_{cos})$ or using some other suitable calculation method. By means of further digital circuits, the signal voltages $U_{sin}$, $U_{cos}$ and the angle $\alpha_{AMR180}$ are stored in memory. Next, measurement is again performed with an auxiliary field $B_H$ applied, or in other words with the planar coil 2 carrying current. Via further logic circuits, the aforementioned range function F is achieved, which with the inclusion of the significance threshold S evaluates the sign of the voltage variations $\delta U_{cos}$ and $\delta U_{sin}$ and decides whether the measurement angle to be output is equal $\alpha_{AMR180}$ or $\alpha_{AMR180}+180°$.

What is claimed is:
1. An arrangement for detecting the angle of rotation of a rotatable element, in which, with evaluation of magnetically variable properties of a sensor arrangement, a first magnetic field, generated or varied by the rotatable element, is detectable in an evaluation circuit and usable for ascertaining the angle of rotation, wherein the sensor arrangement, utilizing the magnetoresistive effect, furnishes signals that can be associated unamiguously with one direction of the magnetic field $B_{ext}$ over a first angular range from 0° to 360°, characterized by means (2) having at least one coil for selective application of a magnetic auxiliary field $B_H$ to the sensor arrangement, by means of which signals a modification of the signals that can be associated with the direction of the first magnetic field $B_{ext}$, attainable for the sake of unambiguous association of an angle over a second angular range from 0° to 360°.

2. The arrangement of claim 1, characterized in that the sensor arrangement has a number of magnetoresistive elements (1/1–1/4; 11/1–11/4), which are interconnected to form at least two bridge circuits, in particular Wheatstone bridges (1, 11), of which one bridge furnishes a signal associated with the cosine of the angle of the first magnetic field $B_{ext}$ with respect to a reference direction, and a further bridge furnishes a signal associated with the sine of this angle.

3. The arrangement of claim 2, characterized in that the magnetoresistive elements are AMR gauge strips (1/1–1/4; 11/1–11/4).

4. The arrangement of claim 1, characterized in that the current flow directions in each of two magnetoresistive elements associated with one bridge branch of the bridge circuits (1, 11) extend perpendicular to one another.

5. The arrangement of claim 1, characterized in that the bridge circuits (1, 11) are rotated, in particular by an angle of 45°, relative to one another.

6. The arrangement of claim 1, characterized in that the magnetic auxiliary field $B_H$ has different directions in the bridge circuits (1, 11), and these directions in particular form an angle of 45°.

7. The arrangement of claim 1, characterized in that the magnetoresistive elements (1/1–1/4; 11/1–11/4) are embodied in meander form.

8. The arrangement of claim 1, characterized in that the magnetic auxiliary field $B_H$ can be generated by means of a planar coil, which by means of a nonconductive intermediate layer is disposed in electrically insulated fashion with respect to the magnetoresistive elements (1/1–1/4; 11/1–11/4) and their metallization.

9. A method for detecting the angle of rotation of a rotatable element, in which, with evaluation of magnetically variable properties of a sensor arrangement, a first magnetic field, caused or vaned by the rotatable element, is detected in an evaluation circuit and used for ascertaining the angle of rotation, characterized by the following steps:

a) determining the signal detected by the sensor arrangement upon application of the first field Bet over a first angular range from 0° to 360°;

b) intermittently applying an additional magnetic auxiliary field a $B_H$ to the sensor arrangement by means having at least one coil;

c) determining the variation of the signals detected by the sensor arrangement relative to the signals detected upon nonapplication of the auxiliary field $B_H$, to obtain an angle of rotationependent variation signals; and d) correlating the variation signals and the signals detected upon nonapplication of the auxiliary field $B_H$ for unambiguously determining angle of rotation from 0° to 360°.

10. The method of claim 9, characterized in that the sensor arrangement has two bridge circuits, in particular Wheatstone bridges, which are rotated relative to one another, in particular by 45°.

11. The method of claim 10, characterized in that the correlation is performed by means of a range function F taking the form $$F=((0° \leq \alpha_{AMR180} \leq f(\alpha_1,\alpha_2)) \text{ AND } ((\delta U_{cos}>S) \text{ OR } ((\delta U_{sin}<-S) \text{ AND } (|\delta U_{cos}|<S)))) \text{ OR } ((f(\alpha_1,\alpha_2)<\alpha_{AMR180} \leq 180°) \text{ AND } ((\delta U_{cos}>S) \text{ OR } ((\delta U_{sin}>S) \text{ AND } (|\delta U_{cos}|<S)))),$$

in which $\alpha_{AMR180}$ represents an angle of rotation detected without the application of the auxiliary field $B_H$; S represents an adjustable significance threshold; $\delta U_{cos}$ and $\delta U_{sin}$ represent the angle-dependent variation signals of the sensor arrangement; and $f(\alpha_1,\alpha_2)$ represents an addition or subtraction function of the angular orientations of the bridge circuits or of the auxiliary field in the bridge circuits with respect to a reference direction.

12. The method of claim 11, characterized in that $f(\alpha_1,\alpha_2)$ is a function taking the form $\alpha_1+\alpha_2$.

13. The method of claim 11, characterized in that $f(\alpha_1,\alpha_2)$ is a function taking the form $|a_1-a_2|$.

* * * * *